(12) United States Patent
Luecken et al.

(10) Patent No.: US 8,338,782 B2
(45) Date of Patent: Dec. 25, 2012

(54) DETECTOR SYSTEM FOR TRANSMISSION ELECTRON MICROSCOPE

(75) Inventors: Uwe Luecken, Eindhoven (NL); Remco Schoenmakers, Best (NL); Frank Jeroen Pieter Schuurmans, Valkenswaard (NL)

(73) Assignee: FBI Company, Hillsboro, OR (US)

( * ) Notice: Subject to any disclaimer, the term of this patent is extended or adjusted under 35 U.S.C. 154(b) by 0 days.

(21) Appl. No.: 13/217,088

(22) Filed: Aug. 24, 2011

(65) Prior Publication Data

US 2012/0049061 A1    Mar. 1, 2012

Related U.S. Application Data

(60) Provisional application No. 61/376,596, filed on Aug. 24, 2010.

(30) Foreign Application Priority Data

Dec. 6, 2010   (EP) .................................. 10193773

(51) Int. Cl.
*H01J 37/26* (2006.01)
*G01N 23/00* (2006.01)
*G21K 7/00* (2006.01)

(52) U.S. Cl. ........................................ 250/311; 250/310

(58) Field of Classification Search .................. 250/307, 250/309, 310, 311, 397
See application file for complete search history.

(56) References Cited

U.S. PATENT DOCUMENTS

| | | | |
|---|---|---|---|
| 2,951,175 A | 8/1960 | Null | |
| 5,157,700 A | 10/1992 | Kurosawa et al. | |
| 5,457,317 A | 10/1995 | Yonehara et al. | |
| 5,569,925 A | 10/1996 | Quinn et al. | |
| 5,578,823 A | 11/1996 | Taniguchi | |
| 5,887,049 A | 3/1999 | Fossum | |
| 5,912,942 A | 6/1999 | Schick et al. | |
| 6,069,935 A | 5/2000 | Schick et al. | |
| 6,225,670 B1 | 5/2001 | Dierickx | |
| 6,285,018 B1 | 9/2001 | Aebi et al. | |
| 6,359,293 B1 | 3/2002 | Woodward | |
| 6,545,303 B1 | 4/2003 | Scheffer | |

(Continued)

FOREIGN PATENT DOCUMENTS

EP         1391932 A1    2/2004
(Continued)

OTHER PUBLICATIONS

Anelli, Giovanni et al., "A high-speed low-noise transimpedance amplifier in a 0.25 um CMOS technology," Nuclear Instruments and Methods in Physics Research Section A, 2003, p. 117-128, vol. 512.

(Continued)

*Primary Examiner* — Bernard E Souw
(74) *Attorney, Agent, or Firm* — Scheinberg & Associates, PC; Michael O. Scheinberg

(57) ABSTRACT

In a transmission electron microscope detector system, image data is read out from the pixels and analyzed during an image acquisition period. The image acquisition process is modified depending on the results of the analysis. For example, the analyses may indicate the inclusion in the data of an image artifact, such as charging or bubbling, and data including the artifact may be eliminated form the final image. CMOS detectors provide for selective read out of pixels at high data rates, allowing for real-time adaptive imaging.

14 Claims, 5 Drawing Sheets

U.S. PATENT DOCUMENTS

| | | | |
|---|---|---|---|
| 6,794,627 | B2 | 9/2004 | Lyon et al. |
| 6,864,919 | B2 | 3/2005 | Hua |
| 6,969,879 | B2 | 11/2005 | Raynor |
| 6,972,795 | B1 | 12/2005 | Etoh et al. |
| 7,030,356 | B2 | 4/2006 | Pain et al. |
| 7,132,637 | B2 | 11/2006 | Nygard |
| 7,139,025 | B1 | 11/2006 | Berezin |
| 7,209,601 | B2 | 4/2007 | Manabe |
| 7,262,411 | B2 | 8/2007 | Nguyen-Huu et al. |
| 8,170,832 | B2 * | 5/2012 | Young et al. .................. 702/170 |
| 2002/0045306 | A1 | 4/2002 | Watanabe |
| 2006/0076492 | A1 | 4/2006 | Taniguchi et al. |
| 2006/0278943 | A1 | 12/2006 | Turchetta et al. |
| 2007/0262404 | A1 | 11/2007 | Meyer et al. |
| 2008/0083939 | A1 | 4/2008 | Guidash |
| 2009/0206428 | A1 | 8/2009 | Meyer et al. |
| 2010/0116977 | A1 * | 5/2010 | Young et al. ............... 250/252.1 |
| 2012/0187285 | A1 * | 7/2012 | Young et al. ............... 250/252.1 |

FOREIGN PATENT DOCUMENTS

| | | |
|---|---|---|
| JP | 5343020 | 12/1993 |
| JP | 2005134181 | 5/2005 |
| JP | 2007200784 | 8/2007 |
| WO | W00017930 | 3/2000 |

OTHER PUBLICATIONS

Baker, Timothy S. et al., "Low resolution meets high: towards a resolution continuum from cells to atoms," Current Opinion in Structural Biology, Oct. 1998, p. 585-594, vol. 6.

Bichsel, Hans, "Inelastic electronic collision cross sections for Monte Carlo calculations," Nuclear Instruments and Methods in Physics Research Section B, 1990, p. 136-139, vol. 52.

Bichsel, Hans, "Straggling in thin silicon detectors," Reviews of Modern Physics, Jul. 1988, p. 663-699, vol. 60, No. 3.

Boscardin, Maurizio et al., "Analysis of the Radiation Hardness and Charge Collection Efficiency of Thinned Silicon Diodes," Nuclear Science Symposium Conference Record, 2004 IEEE, p. 904-907, vol. 2.

Bottcher, B. et al., "Determination of the fold of the core protein of hepatitis B virus by electron cryomiscroscopy," Medical Research Council Laboratory of Molecular Biology, Mar. 1997, p. 88-91, Nature vol. 386.

Campbell, M. et al., "A Readout Chip for a 64x64 Pixel Matrix with 15-bit Single Photon Counting." IEEE Transactions on Nuclear Science, Jun. 1998, p. 751-753, vol. 45, No. 3.

Anonymous, "Centre for Instrumentation 2001-2003," CCLRC, Jun. 2003.

Chen, W. et al., "Active Pixel Sensors on High-Resistivity Silicon and Their Readout," IEEE Transactions on Nuclear Science, Jun. 2002, p. 1006-1011, vol. 49, No. 3.

Chen, W. et al., "High resistivity silicon active pixel sensors for recording data from STEM," Nuclear Instruments and Methods in Physics Research Section A, 2003, p. 368-377, vol. 512.

Cho, Kwang-Bo, et al., "A 1.5-V 550-uW 176x144 Autonomous CMOS Active Pixel Image Sensor," IEEE Transactions on Electron Devices, Jan. 2003, p. 96-105, vol. 50, No. 1.

Claus, G. et al., "Monolithic active pixel sensors for a linear collider," Nuclear Instruments and Methods in Physics Research Section A, 2001, p. 83-85, vol. 473.

Freeman, J. et al., "Hybrid photodiode crosstalk due to backscattered electrons," Nuclear Instruments and Methods in Physics Research, Section A, 2001, p. 143-150, vol. 474.

Kabir, M.Z. et al., "Direct conversion X-ray sensors: sensitivity, DQE and MTF," IEEE Proceedings—Circuits, Devices and Systems, Aug. 2003, p. 258-266, vol. 150, No. 4.

McMullan, G. et al., "Experimental observation of the improvement in MTF from backthinning a CMOS direct electron detector," Ultramicroscopy, 2009, p. 1144-1147, vol. 109.

Meyer, Rudiger R. et al., "The effects of electron and photon scattering on signal and noise transfer properties of scintillators in CCD cameras used for electron detection," Ultramicroscopy, 1998, p. 23-33, vol. 75.

Claus, G. et al., "Particle tracking using CMOS monolithic active pixel sensor," Nuclear Instruments and Methods in Physics Research, Section A, 2001, p. 120-124, vol. 465.

Cohen, Muriel et al., "Radiation-Induced Dark Current in CMOS Active Pixel Sensors," IEEE Transactions on Nuclear Science, Dec. 2000, p. 2485-2491, vol. 47, No. 6.

Czyzewski, Zbigniew et al., "Calculations of Mott scattering cross section," Journal of Applied Physics, Oct. 1990, p. 3066-3072, vol. 68, Issue 7.

Daberkow, I. et al., "Performance of electron image converters with YAG single-crystal screen and CCD sensor," Ultramicroscopy, 1991, p. 215-223, vol. 38.

Dalinenko, I. et al., "Design and fabrication technology of thinned backside-excited CCD imagers and the family of the intensified electron-bombarded CCD image tubes," Proc. SPIE, 1995, p. 197, vol. 2551.

Dalinenko, I. et al., "Design and fabrication technology of thinned backside-excited CCD imagers and the family of the electron-bombarded CCD image tubes," Nuclear Instruments and Methods in Physics Research Section A, 1997, p. 294-296, vol. 387.

Davies, Christopher et al., "Electrons and X-rays gang up on the ribosome," Structure, 2000, p. R41-R45, vol. 8.

Debusschere, I. et al., "Electron Detection by Means of Silicon Solid State imagers," Nuclear Instruments and Methods in Physics Research Section A, 1988, p. 636-639, vol. 273.

Faruqi, A.R. et al., "Digital Detectors for Electron Microscopy," MRC Laboratory of Molecular Biology, Cambridge U.K., 2001, p. 1-14.

Faruqi, A.R. et al., "Direct electron detection methods in electron microscopy," Nuclear Instruments and Methods in Physics Research, Section A, 2003, p. 317-321, vol. 513.

Faruqi, A.R. et al., "Direct single electron detection with a CMOS detector for electron microscopy," Nuclear Instruments and Methods in Physics Research, Section A, 2005, p. 170-175, vol. 546.

Faruqi, A.R. et al., "Electronic detectors in electron microscopy," Current Opinion in Structural Biology, 2007, p. 549-555, vol. 17.

Frank, Joachim, "The ribosome—a macromolecular machine par excellence," Chemistry & Biology, 2000, p. R133-R141, vol. 7.

Frank, Joachim et al., "Three-Dimensional Cryoelectron Microscopy of Ribosomes," Methods in Enzymology, 2000, p. 276-291, vol. 317.

Friedl, M. et al., "Readout of silicon strip detectors with position and timing information," Nuclear Instruments and Methods in Physics Research, Section A, Aug. 15, 2008, p. 82-83, vol. 598.

Fuchs, E. et al., "Particle Beam Microanalysis—Fundamentals, Methods and Applications," VCH Weinheim New York Basel Cambridge, Federal Republic of Germany, 1990, p. 42-45.

Gabashvili, Irene S. et al., "Solution Structure of the E. coli 70S Ribosome at 11.5 Å Resolution," Cell Press, Mar. 3, 2000, p. 537-549, vol. 100.

Ruedi, Pierre-Francois, "A 128x128 Pixel 120-dB Dynamic-Range Vision-Sensor Chip for Image Contrast and Orientation Extraction," IEEE Journal of Solid-State Circuits, Dec. 2003, p. 2325-2333, vol. 38, No. 12.

Gruhn, C.R., "A Thin All Epitaxial Silicon Detector with Internal Amplification," IEEE Transactions on Nuclear Science, Feb. 1976, p. 145-152, vol. NS-23, No. 1.

Waeny, M. et al., "High Sensitivitiy High Dynamic, Digital CMOS Imager," Proceedings of SPIE, 2001, p. 78-84, vol. 4306.

Lee, Denny L.Y. et al., "Direct-Conversion X-Ray Imaging Detector Improvements and Observations," Proceedings of SPIE, 2003, p. 162-166, vol. 5199.

Kabir, M. Zahangir et al., "Charge transport and trapping-limited sensitivity and resolution of pixellated x-ray image detectors," Proceedings of SPIE, 2003, p. 26-37, vol. 5030.

Kleinfelder, Stuart, "High-speed, high-sensitivity, low-noise scientific CMOS image sensors," 2004, Proceedings of SPIE, p. 194-205, vol. 5274.

Lauxtermann, S. et al., "A megapixel CMOS imager with charge binning," Proceedings of SPIE, 2001, p. 85-92, vol. 4306.

Marques, C. et al., "Experimental characterization and simulation of Quantum Efficiency and Optical Crosstalk of CMOS photodiode APS," Proceedings of SPIE, 2002, p. 107-116, vol. 4669.

Hancock, B.R. et al., "Total Dose Testing of a CMOS Charged Particle Spectrometer]," Jet Propulsion Laboratory, California Institute of Technology, Dec. 1997, http://hdl.handle.net/2014/22709.

Heijne, Erik N.M., "Semiconductor micropattern pixel detectors: a review of the beginnings," Nuclear Instruments and Methods in Physics Research, Section A, 2001, p. 1-26, vol. 465.

Hopkinson, Gordon R., "Radiation Effects in a CMOS Active Pixel Sensor," IEEE Transactions on Nuclear Science, Dec. 2000, p. 2480-2484, vol. 47, No. 6.

Horacek, Miroslav, "Direct detection of electrons by area array CCD," Conference Proceedings of the 9th International CzechSlovak Scientific Conference, 1989, p. 1-4.

Instrumentation Division, "R&D Programs Facilities Staff," Brookhaven National Laboratory, Apr. 2003, p. 1-62.

Janesick, James et al., "Developments and Applications of High Performance CCD and CMOS Imaging Arrays," Annual Reviews, Nuclear and Particle Science, 2003, p. 263-300, vol. 43.

Johnson, M.W. et al., "Silicon APS detectors for neutron scattering," Nuclear Instruments and Methods in Physics Research, Section A, 2003, p. 72-79, vol. 501.

Joy, David C., "Monte Carlo Modeling for Electron Microscopy and Microanalysis," Oxford University Press, 1995.

Kleinfelder, Stuart et al., "Novel Integrated CMOS Sensor Circuits," IEEE Transactions on Nuclear Science, Oct. 2004, p. 2328-2336, vol. 51, No. 5.

Kleinfelder, Stuart et al., "Novel Integrated CMOS Pixel Structures for Vertex Detectors," Nuclear Science Symposium Conference Record, Oct. 2003, p. 335-339.

Kleinfelder, Stuart et al., "Integrated X-ray and charged particle active pixel CMOS sensor arrays using an epitaxial silicon sensitive region," Lawrence Berkeley National Laboratory, Jul. 1, 2001, http://escholarship.org/uc/item/66p6h8r6.

Jenkins, D.G. et al., "Use of silicon self-scanned linear photodiode arrays for the direct display of transmission electron microscope energy loss spectra," Electronics Letters, Mar. 16, 1978, p. 174-175, vol. 14, No. 6.

Krymski, Alexander I. et al., "A 9-V Lux-s 5000-Frames-s 512×512 CMOS Sensor," IEEE Transactions on Electron Devices, Jan. 2003, p. 136-143, vol. 50, Issue 1.

Lata, Ramani et al., "Maturation Dynamics of a Viral Capsid: Visualization of Transitional Intermediate States," Cell Press, Jan. 21, 2000, p. 253-263, vol. 100, Issue 2.

Brau, Jim et al., "Linear Collider Detector R&D," Aug. 28, 2002, http://blueox.uoregon.edu/~lc/randd.ps(pdf).

Snoeys, W. et al., "Layout techniques to enhance the radiation tolerance of standard CMOS technologies demonstrated on a pixel detector readout chip," Nuclear Instruments and Methods in Physics Research, Section A, 2000, pp. 349-360, vol. 439.

Stein, Derek M. et al., "Feedback-controlled ion beam sculpting apparatus," Review of Scientific Instruments, Apr. 2004, pp. 900-905, vol. 75, No. 4.

Straver, J. et al., "One micron spatial resolution with silicon strip detectors," Nuclear Instruments & Methods in Physics Research, Section A, 1994, pp. 485-490, vol. 348.

Struder, L., "High-resolution imaging X-ray spectrometers," Nuclear Instruments and Methods in Physics Research, Section A, 2000, pp. 73-113, vol. 454.

Kisielowski, Christian et al., Report, Third TEAM Workshop, Aug. 8, 2003, pp. 1-43, San Antonio, Texas.

Thuman-Commike, P.A. et al., "Reconstruction principles of icosahedral virus structure determination using electron cryomicroscopy," Micron, 2000, pp. 687-711, vol. 31.

Turchetta, R. et al., "A monolithic active pixel sensor for charged particle tracking and imaging using standard VLSI CMOS technology," Nuclear Instruments and Methods in Physics Research, Section A, 2001, pp. 677-689, vol. 458.

Turchetta, R. et al., "Monolithic active pixel sensors (MAPS) in a VLSI CMOS technology," Nuclear Instruments and Methods in Physics Research, Section A, 2003, pp. 251-259, vol. 501.

Turchetta, R., "CMOS Monolithic Active Pixel Sensors (MAPS) for scientific applications," 9th Workshop on Electronics for LHC Experiments, Sep. 29-Oct. 3, 2003, pp. 28-33, Amsterdam, The Netherlands.

Turchetta, R., "CMOS Sensors for the detection of Minimum Ionising Particles," Rutherford Appleton Laboratory, 1997.

Turchetta, R., "Spatial resolution of silicon microstrip detectors," Nuclear Instruments & Methods in Physics Research, Section A, 1993, pp. 44-58, vol. 335.

Van Zant, Peter, "Microchip Fabrication, A Practical Guide to Semiconductor Processing, Fifth Edition," McGraw-Hill, 2004, p. 391.

Anonymous, "Detective Quantum Efficiency—Lecture 9," Spring 2002, 19 pages.

Faruqi, Wasi, "Direct Detection in Silicon: Hybrid Pixel Detector: Medipix2," www2.mrc-lmb.cam.ac.uk/personal/arf/medipix.html, obtained Dec. 5, 2009, 2 pages.

Faruqi, A.R., "Prospects for Hybrid Pixel Detectors in Electron Microscopy," Nuclear Instruments and Methods in Physics Research A, 2001, vol. 466, pp. 146-154.

King, Wayne E., et al., "Ultrafast Electron Microscopy om <aterials Science, Biology, and Chemistry," Journal of Applied Physics, Jun. 8, 2005, vol. 97, 28 pages.

Lindtrom, G., et al., "Radiation Hardness of Silicon Detectors—A Challenge from High Energy Physics," 2nd International Conference on Radiation Effects on Semiconductor Materials, Detectors and Devices, Mar. 4-6, 1998, 18 pages.

Moldovan, Grigore, et al., "Can Direct Electron Detectors Outperform Phosphor-CCD Systems for TEM?" Electron Microscopy and Analysis Group Conference, 2007, 4 pages.

Moldovan, G., et al., "Direct Electron Detectors for TEM," EMC 2008 14th European Microscopy Congress Sep. 1-5, 2008, pp. 85-86.

Tuceryan, Mihran, et al., "Texture Analysis," The Handbook of Pattern Recognition and Computer Vision (2nd Edition), 1998, pp. 207-248.

Won, You-Yeon, "Imaging Nanostructured Fluids Using Cryo-TEM," Korean J. Chem. Eng., 2004, 2004, vol. 21, No. 1.

Fan, G.Y. et al., "ASIC-based event-driven 2D digital electron counter for TEM imaging," Ultramiscroscopy, 1998, p. 107-113, vol. 70.

Fan, G.Y. et al., "Digital imaging in transmission electron microscopy," Journal of Microscopy, Oct. 2000, p. 1-13, vol. 200.

Fan, G.Y. et al., "Multiport-readout frame-transfer 5 megapixel CCD imaging system for TEM applications," Ultramicroscopy, 2000, p. 75-84, vol. 84.

Carlson, Bradley S., "P1-12: Comparison of Modern CCD and CMOS Image Sensor Technologies and Systems for Low Resolution Imaging," Proceedings of IEEE, Sensors, 2002, p. 171-176.

Faruqi, A.R., "Prospects for hybrid pixel detectors in electron microscopy," Nuclear Instruments and Methods in Physics Research, Section A, 2001, p. 146-154, vol. 466.

Faruqi, A.R. et al., "A high sensitivity imaging detector for electron microscopy," Nuclear Instruments and Methods in Physics Research, 1995, p. 408-412, vol. 367.

Faruqi, A.R. et al., "Cooled CCD camera with tapered fibre optics for electron microscopy," Nuclear Instruments and Methods in Physics Research, Section A, 1997, p. 233-236, vol. 382.

Faruqi, A.R. et al., "Cooled CCD detector with tapered fibre optics for recording electron diffraction patterns," Ultramicroscopy, 1999, p. 235-250, vol. 75.

Faruqi, A.R., "Cooled CCD's for recording data from electron microscopes," Nuclear Instruments and Methods in Physics Research, Section A, 2000, p. 606-610, vol. 439.

Llopart, X. et al., "First test measurements of a 64k pixel readout chip working in single photon counting mode," Nuclear Instruments and Methods in Physics Research, Section A, 2003, pp. 157-163, vol. 509.

Llopart, X. et al., "Medipix2: a 64-k Pixel Readout Chip With 55-μm Square Elements Working in Single Photon Counting Mode," IEEE Transactions on Nuclear Science, Oct. 2002, pp. 159-163.

Lupton, J.E. et al., "Measurements of Electron Detection Efficiencies in Solid State Detectors," Nuclear Instruments and Methods, 1972, pp. 189-191, vol. 98.

Manolopoulos, S. et al., "Simulation of monolithic active pixels in deep sub-micron technologies," Nuclear Instruments and Methods in Physics Research, Section A, 2002, pp. 181-187, vol. 487.

Mapson-Menard, H.C. et al., "Performance evaluation of an Active Pixel Sensor Test Structure for space science applications," Nuclear Instruments and Methods in Physics Research, Section A, 2003, pp. 313-316, vol. 513.

Matis, H. et al., "A CMOS Active Pixel Sensor for Charged Particle Detection," IEEE, 2003, pp. 259-263.

Matis, H. et al., "Charged Particle Detection Using a CMOS Active Pixel Sensor," IEEE Transactions on Nuclear Science, Aug. 2003, pp. 1020-1025, vol. 50, No. 4.

Unknown, "The Medipix1 Chip (PCC)," http://medipix.web.cern.ch/MEDIPIX/Medipix1/medipix1.html.

Unknown, "Welcome to the Medipix2 Home Page!," http://medipix.web.cern.ch/MEDIPIX/Medipix2/indexMPIX2.html.

Meyer-Ilse, W. et al., "Thinned back-illuminated CCD for x-ray microscopy," SPIE, 1993, pp. 241-245, vol. 1900.

Meyer, R. et al., "The effects of electron and photon scattering on signal and noise transfer properties of scintillators in CCD cameras used for electron detection," Ultramicroscopy, 1998, pp. 23-33, vol. 75.

Meynants, G. et al., "CMOS active pixel image sensor with CCD performance," SPIE, May 1998, pp. 68-78, vol. 3410.

Milazzo, A. et al., "Active pixel sensor array as a detector for electron microscopy," Ultramicroscopy, 2005, pp. 152-159, vol. 104.

Morrissey, Q.R. et al., "Design of a 3 µm pixel linear CMOS sensor for earth observation," Nuclear Instruments & Methods in Physics Research, Section A, 2003, pp. 350-357, vol. 512.

Sze, S.M., "Physics of Semiconductor Devices, 2nd Edition," John Wiley & Sons, Inc., 1981, p. 749.

Prydderch, M.L. et al., "A 512×512 CMOS Monolithic Active Pixel Sensor with integrated ADCs for space science," Nuclear Instruments & Methods in Physics Research, Section A, 2003, pp. 358-367, vol. 512.

Reimer, Ludwig et al., "Transmission Electron Miscroscopy" Physics of Image Formation, Fifth Edition, 2008, Spring Science +Business Media, LLC.

Roberts, P.T.E. et al., "A CCD-Based Image Recording System for the CTEM," Ultramicroscopy, 1982, pp. 385-396, vol. 8.

Sawada, Hidetaka et al., "Correction of higher order geometrical aberration by triple 3-fold astigmatism field," Journal of Electron Microscoopy, 2009, pp. 341-347, vol. 58(6).

Schwarz, C. et al., "X-ray Imaging Using a Hybrid Photon Counting GaAs Pixel Detector," Nuclear Physics B (Proc. Suppl.), 1999, pp. 491-496, vol. 78.

Schweickart, Russell B. et al., "Flexible Heat Pipes for CCD Cooling on the Advanced Camera for Surveys," SPIE Conference on Space Telescopes and Instruments V, Mar. 1998, pp. 292-300, vol. 3356.

Sexton, F.W. et al., "Qualifying Commercial ICs for Space Total-Dose Environments," IEEE Transactions on Nuclear Science, Dec. 1992, pp. 1869-1875, vol. 39, No. 6.

Snoeys, Walter et al., "Integrated Circuits for Particle Physics Experiments," IEEE Journal of Solid-State Circuits, Dec. 2000, pp. 2018-2030, vol. 35, No. 12.

Chen James Z., et al., "A dose-rate effect in single-particle electron microscopy", Journal of Structural Biology, Oct. 1, 2007, pp. 92-100, vol. 161, Issue 1.

Schaffer Bernhard, et al., "Automated spatial drift correction for EFTEM image series", Ultramicroscopy, Dec. 1, 2004, pp. 27-36, vol. 102, Issue 1.

Egerton R F, "Electron energy-loss spectroscopy in the TEM", Reports on Progress in Physics, Dec. 16, 2008, 25 pp., vol. 72, Issue 1.

Faruqi, A R, "Principles and prospects of direct high resolution electron image acquisition with CMOS detectors at low energies", Journal of Physics: Condensed Matter, Jul. 7, 2009, 9 pp., vol. 21, Issue 31.

McMullan, G., et al, "Detective quantum efficiency of electron area detectors in electron microscopy", Ultramicroscopy, Aug. 2009, pp. 1126-1143, vol. 109, Issue 9.

Faruqi, A R, "Pixel detectors for high-resolution cryo-electron microscopy", Nuclear Instruments & Methods in Physics Research, May 24, 2005, pp. 192-198, vol. 549, Issues 1-3.

Ay, Suat U. et al., "CMOS Active Pixel Sensor (APS) Imager for Scientific Applications," Proceedings of SPIE, 2002, p. 271, vol. 4836.

Amati, M. et al., "Hybrid Active Pixel Sensors and SOI Inspired Option," Nuclear Instruments and Methods in Physics Research, Section A: Accelerators, Spectrometers, Detectors and Associated Equipment, Issues 1-2, Sep. 21, 2003, p. 265-270, vol. 511.

Delpierre, P. et al., "Large scale pixel detectors for DELPHI at LEP200 and ATLAS at LHC," Nuclear Instruments and Methods in Physics Research Section A, 1994, p. 233-239, vol. 342.

Denes, P. et al., "Active Pixel Sensors for electron miscroscopy," Nuclear Instruments and Methods in Physics Research Section A, 2007, p. 891-894, vol. 579.

Deptuch, G. et al., "Simulation and measurements of charge collection in monolithic active pixel sensors," Nuclear Instruments and Methods in Physics Research Section A, 2001, p. 92-100, vol. 465.

Deputch, G., "Tritium autoradiography with thinned and back-side illuminated monolithic active pixel sensor device," Nuclear Instruments and Methods in Physics Research Section A, 2005, p. 537-548, vol. 543.

Downing, Kenneth H. et al., "Performance of a 2k CCD camera designed for electron crystallography at 400 kV," Ultramicroscopy, 1999, p. 215-233, vol. 75.

Downing, Kenneth H. et al., "Analysis of Photographic Emulsions for Electron Microscopy of Two-Dimensional Crystalline Specimens," Ultramicroscopy, 1982, p. 381-404, vol. 7.

Dyck, Rudolph H. et al., "Integrated Arrays of Silicon Photodetectors for Image Sensing," IEEE Transactions on Electron Devices, Apr. 1968, p. 196-201, vol. 15 No. 4.

Eid, El-Sayed, "Study of Limitations on Pixel Size of Very High Resolution Image Sensors," Eighteenth National Radio Science Conference, Mar. 27-29, 2001, Mansoura Univ., Egypt.

Eid, El-Sayed et al., "Design and Characterization of Ionizing Radiation-Tolerant CMOS APS Image Sensors up to 30 Mrd (Si) Total Dose." IEEE Transactions on Nuclear Science, Dec. 2001, p. 1796-1806, vol. 48 No. 6.

Evans, D.A. et al., "CMOS active pixel sensors for ionising radiation," Nuclear Instruments and Methods in Physics Research Section A, 2005, p. 281-285, vol. 546.

Everhart, T.E. et al., "Determination of Kilovolt Electron Energy Dissipation vs Penetration Distance in Solid Materials," Journal of Applied Physics, Dec. 1971, p. 5837-5843, vol. 42 No. 13.

Villani, Enrico Giulio et al., "Analysis and simulation of charge collection in Monolithic Active Pixel Sensors (MAPS)," Nuclear Physics B (Proc. Suppl.), 2003, pp. 184-188, vol. 125.

Voelkl, E. et al., "Electron Holography: Recent Developments," Scanning Microscopy, 1997, pp. 407-416, vol. 11.

Voelkl, E. et al., "Improving Image Quality and Reducing Drift Problems via Automated Data Acquisition and Averaging in a Cs-Corrected TEM," Microscopy Today, Nov. 2008, pp. 36-38.

Weilhammer, Peter, "Overview: silicon vertex detectors and trackers," Nuclear Instruments and Methods in Physics Research, Section A, 2000, pp. 60-70, vol. 453.

Wernes, Norbert, "Trends in Pixel Detectors: Tracking and Imaging," IEEE Transactions on Nuclear Science, Jun. 2004, pp. 1006-1015, vol. 51, No. 3.

Woodhouse, Guy F.W. et al., "CMOS Active Pixel Sensor Developments At the Rutherford Appleton Laboratory," Scientific Detectors for Astronomy, Astrophysics and Space Science Library, 2004, pp. 183-194, vol. 300, Section 1.

Xuong, Nguyen-Huu et al., "First Use of a High Sensitivity Active Pixel Sensor Array as a Detector for Electron Microscopy," Sensors and Camera Systems for Scientific Industrial and Digital Photography Applications V, 2004, pp. 242-249, vol. 5301.

Zhou, Zhimin et al., "Frame-Transfer CMOS Active Pixel Sensor with Pixel Binning," IEEE Transactions on Electron Devices, Oct. 1997, pp. 1764-1768, vol. 44, No. 10.

Zuo, J.M., "Electron Detection Characteristics of a Slow-Scan CCD Camera, Imaging Plates and Film, and Electron Image Restoration," Microscopy Research and Technique, 2000, pp. 245-268, vol. 49.

Li, D. X., et al., 'The Characterization of Nb-Al2O3 and Nb-MgO Interfaces in MBE Grown Nb-MgO-Nb-Al2O3 Multilayers,' Acta Metall. Mater., 1992, p. 237-247, vol. 40.

Faruqi, A.R., et al., "Evaluation of a Hybrid Pixel Detector for Electron Microscopy." Ultramicroscopy, 2003, p. 263-276, vol. 94.

Cain, Stephen C., et al., "Projection-Based Image Registration in the Presence of Fixed-Pattern Noise" IEEE Transactions on Image Processing, Dec. 2001, p. 1860-1872, vol. 10, No. 12.

Chen, C.H., et al., "The Handbook of Pattern Recognition and Computer Vision (2nd Edition)," World Scientific Publishing Co., 1998, p. 207-248.

Roseman, Alan M., "Particle finding in Electron Micrographs using a Fast Local Correlation Algorithm," Ultramicroscopy, 2003, p. 225-236, vol. 94.

Roseman, A.M., "FindEM—A Fast, Efficient Program for Automatic Selection of Particles from Electron Micrographs," Journal of Structural Biology, 2004, pp. 91-99, vol. 145.

Zhu, Yuanxin, et al., "Automatic Particle Selection: Results of a Comparative Study," Journal of Structural Biology, 2004, pp. 3-14, vol. 145.

* cited by examiner

DETECTOR SYSTEM FOR TRANSMISSION ELECTRON MICROSCOPE

This application claims priority from U.S. Provisional Patent Application 61/376,596, filed Aug. 24, 2010, which is hereby incorporated by reference.

TECHNICAL FIELD OF THE INVENTION

The present invention relates to electron microscopy, and in particular, to a detector system for use with electron microscopy.

BACKGROUND OF THE INVENTION

A transmission electron microscope (TEM) transmits an electron beam through a thin sample and detects changes in the electron beam caused by interactions between the electrons and the sample. The electrons are typically accelerated to energies of between 80 and 300 keV. The acceleration is preferably done by maintaining the electron source at a high voltage and accelerating the electrons toward a sample at ground potential. Deflectors, lenses, and aberration correctors may manipulate the beam to irradiate the sample. The sample is sufficiently thin to be partially transparent to the electrons.

Because the transparency to electrons depends on the atomic number of the element, the typical sample thickness will vary with the nature of the sample. For example, samples composed of metals or semiconductors, which include many atoms having high atomic numbers, may be about 30 nm thick. Sample of biological materials are typically thicker, for example, about 200 nm thick. Even thicker samples, for example, 1 µm samples may be used in some applications.

Some electrons pass through the sample unhindered; some electrons are diffracted; some electrons lose energy; and some electrons are absorbed. Different techniques utilize different characteristics of the transmitted electrons to determine different information about the sample. A TEM can produce images that show structural features as in the nanometer or even sub-nanometer range and can also provide information about the composition of the sample.

After the electrons pass through the sample, they are detected by photographic film or by an electron detector that produces an electronic signal representative of the number and/or energy of electrons that impinge on the detector. Most TEM electron detectors detect the electrons indirectly: the electrons impinge on a phosphor, which emits light that is detected by the detector. Indirect detection prevents damage to the semiconductor detector by the impact of the high-energy electrons. The light impinges on a semiconductor detector and creates electron-hole pairs. In many indirect semiconductor detectors, the electrons accumulate in an array of capacitors that form part of a charged-coupled device (CCD). The accumulated charge on each capacitor is related to the number of electrons that impinged on the corresponding pixel. To read the charge on each pixel to obtain a complete image, the charge accumulated at each pixel is moved to the next pixel, like a bucket brigade, and eventually out of the detector where it is digitized and stored in a computer memory. The extra step of converting the electrons to light reduces the detector resolution because the light from the phosphor spreads before it reaches the CCD detector. Another disadvantage of the CCD detector is the time required to read out the array of pixels, and the limited field of view provided.

Some semiconductor detectors directly detect electrons, using active or passive pixel sensors, instead of a CCD. For example, a monolithic active pixel sensor (MAPS) implemented using complementary metal oxide silicon (CMOS) technology provides for a high-resolution detector with fast read out. In an active pixel sensor, each pixel can incorporate many of the functions required for particle detection, i.e., charge generation and collection, pre-amplification, pulse shaping, analog-to-digital conversion, noise discrimination and signal integration.

Active pixel sensors are described, for example, by R. Turchetta et al. in U.S. Pat. Pub. No. 2006/278943, for "Accelerated particle and high energy radiation sensor," which is hereby incorporated by reference. Another type of active pixel sensor, is described in A. R. Faruqi et al., "Evaluation of a Hybrid Pixel Detector for Electron Microscopy." Ultramicroscopy, vol. 94, 2002, pp. 263-276. In the hybrid active pixel detector of Faruqi et al., the sensitive read-out circuitry is located below the portion impinged by the electrons and is therefore protected from the electron impact. In another type of direct electron detector, a double-sided strip detector (DSSD), the read-out system is not in line with the electron beam and so does not degrade. The DSSD uses collection strips on the top and bottom of the detector and can provide information about each electron event as it occurs, allowing the processor to determine, for example, when two electrons strike at about the same time.

The sample in a TEM is maintained in a vacuum, because air or other gas molecules in the sample chamber would scatter the electrons in the beam. Biological samples, which contain a large amount of water would quickly degrade in a high vacuum environment. Some techniques for preserving biological samples for observation in a TEM include staining or other fixing techniques that can introduce artifacts into the observation. Artifacts are observed features that are a result of the imaging process, and are not naturally occurring in the sample. A preferred preservation technique, which better maintains the integrity of a biological sample, is to rapidly freeze in a vitrification process that produces amorphous ice, and to observe it at cryogenic temperature. Cryogenic transmission electron microscopy (Cryo-TEM) entails the observation of samples at cryogenic temperatures, typically liquid nitrogen or liquid helium temperatures, on a transmission electron microscope. Cryo-TEM allows viewing a specimen in its native state without introducing artifacts into the observation during a fixing process.

Images from a cryo-TEM, however, are degraded by various processes that occur during the observation. For example, the impact of high energy electrons in the beam heats the thin sample which, and after a short period of observation can cause bubbles in the sample. Another problem with cryo-TEM is that samples accumulate a static electric charge at the beginning of imaging, which produces significant streaking in the corners of the image. The charge dissipates after a brief period. To avoid the charging artifact, a user will sometimes pre-illuminate a sample to eliminate charging before forming an image. Users also use spot-scan imaging to overcome charging and beam induced movement. Both these methods have the undesirable effect of reducing the time that the electron beam is producing useful information, since the pre-illumination begins to heat the sample, but does not produce useful image data.

SUMMARY OF THE INVENTION

An object of the invention is to improve the quality TEM imaging.

A preferred embodiment includes an electron detector in which image data from all or less than all of the pixels in the detector are read out at different points of time during an image acquisition period. The data from the different points of times are analyzed to determine which data to include in a final image. In a preferred embodiment, the data is read out and analyzed in real time, that is, while the electron beam is impinging on the sample and generating image data. The data acquisition process can then be modified during the image acquisition period based upon the results of the analysis. The final image data can include all or less than all of the collected data. In other embodiments, data read out at different points of time is stored separately, and is later analyzed and combined to form the final image.

In one embodiment, artifacts that degrade the image acquired using cryo-or other low electron dose TEM can be reduced or eliminated by analyzing data obtained at different times during the image acquisition period to identify and eliminate image data corresponding to artifacts. For example, data taken at the beginning of an image acquisition period from fewer than all the pixels is used to determine when charging is complete, and only image data that is not affected by charging is collected. In another embodiment, image data is analyzed to determine whether the sample is bubbling, and the image-forming period is ended at the onset of bubbling.

The foregoing has outlined rather broadly the features and technical advantages of embodiment of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

DETAILED DESCRIPTION OF PREFERRED EMBODIMENTS

Figure 1:
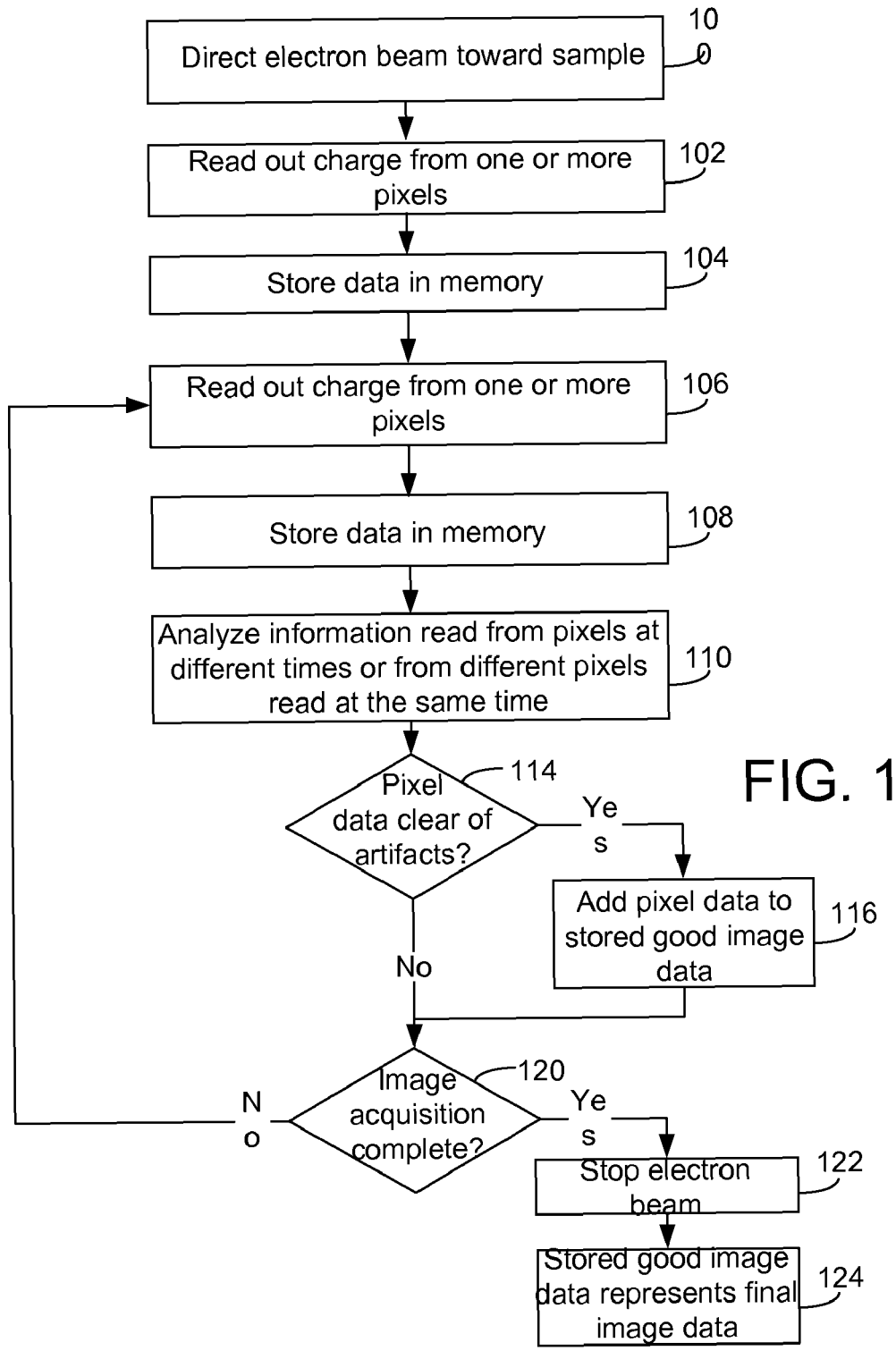
FIG. 1 is a flow chart showing a preferred embodiment of the present invention.

Imaging artifacts that occur in images from an electron microscope may render the image less useful. Many artifacts change over time and can be identified and eliminated by comparing image data taken at different times during an image acquisition period. Some artifacts may also be identified by comparing data representing different regions of a single frame. "Frame" as used herein, means a group of pixel data read out in a single read-out period, that is, a group of pixel data read out at essentially the same time. The frame may include data from all pixels or from fewer than all pixels. In a preferred embodiment of the present invention, image data is read from the detector at multiple times while the image is being acquired. That is, a single image can be formed using data from multiple frames. The image data from the different times, or from different parts of the image at the same time, can be compared to determine the presence of artifacts, and such artifacts can be eliminated from the final image by manipulating or eliminating parts of the collected data.

For example, specimen charging is a problem in cryo-microscopy and takes place at the beginning of the imaging process. Data can be read out from pixels during image acquisition, and image data showing charging artifacts can be identified and eliminated. Another problem in cryo-microscopy is bubbling, which typically takes place toward the end of image acquisition. Embodiments of the invention allow a user to disentangle these effects from the data acquired under better specimen imaging conditions, hence significantly increasing the data quality and scientific usability of the images.

A preferred embodiment of the invention uses a CMOS detector, which provides faster readout than a CCD detector and allows reading out of selected pixels. The fast read-out capability, the ability to selectively read out specified pixels, and the on-chip image processing in a preferred embodiment allows data to be analyzed and decisions to be made while image data is being collected, and the imaging process can be adjusted in real time to produce a better image.

Based upon the analysis of data read out during the image acquisition period, the image acquisition process may be continued, altered, or ceased. For example, altering the acquisition process may include discarding some or all of image data collected, storing image collected before or after the analysis at different memory locations, or ceasing data collection. For example, if the data indicates that the image data being collected is good data, the data collection may continue without change. If the data analysis indicates that the data being collected includes undesirable artifacts, the data may be eliminated from the final image data. The data analysis and the alteration of the acquisition process can be different at different stages of the image collection. For example, the data analysis can be looking for charging artifacts early on in the image acquisition period to discard image data that includes charging artifacts, and good data may start to accumulate after the charging artifact disappears. Later in the image acquisition period, the analysis can be looking for bubbling and the system can cease data collection when bubbling commences. The invention obtains the maximum good image data from the electrons impacting the specimen.

FIG. 1 is a flow chart showing a preferred embodiment of the invention. In step 100, an electron beam is directed toward the sample. Electrons that pass through the sample impact a detector pixel array below the sample and are converted to electric charges that are stored at the impacted pixel. In step 102, the stored charge is "read out" from one or more pixels and digitized. By "read-out" is meant that an electronic signal corresponding to the charge is provided to circuitry outside the pixel. The charge on the pixel may or may not be reset when the pixel is read out. The electronic signals can be read from all the pixels in the array or from less than all the pixels in the array. The read-out operation preferably includes resetting the pixels to a baseline, so that charge begins to accumulate anew. Alternatively, subsequent read-outs can subtract the previously read out values to determine the charge that has accumulated since the last read-out operation. In step 104, the image data that was read is stored in memory, preferably in digital form.

In step 106, information is again read out from the same pixels that were read in step 102. The information is stored in memory in step 108. For example, in one embodiment, including a 4k by 4k pixel array, data is read out at a frequency of 40 Hz, that is, every 25 ms. Step 106 occurs later than step 102, so the information represents electrons that impacted the detector pixels after step 102. In step 110, the two sets of pixel data read out at different times and stored in memory are analyzed by a processor to determine a property of the collected image data. For example, the analyses may determine whether the image includes an imaging artifact. In some embodiments, the analysis may compare different pixels of the same frame, rather than pixels from different frames representing data from different times.

The system determines, based on the results of the analysis, in decision block 114 whether the data just retrieved is free of image artifacts and should be added to the accumulated data that forms the final image. If so, the data is added in step 116 to the memory locations accumulating the "good" image data. If decision block 114 indicates that the data is not good image data, that is, the data includes an undesirable artifact, the data is not added to the accumulated "good" image data. Collected data, whether or not added to the accumulated good data, may also remain stored separately for comparison with subsequent data or for other data manipulation and combination.

In decision block 120, the system determines from the analysis in step 110 whether the image acquisition process is complete. If it is, the electron beam is stopped from impacting the sample in step 122, and in step 124, the accumulated data is stored as final image data. If the results of step 120 indicate that the image acquisition process is not complete, the process continues to collect data with step 106.

In some embodiments, the processing can be performed off-line by storing the frames of image data for later processing. This may be desirable when the number of pixels is so large that the number of calculations required cannot be performed in real time. Because of the amount of memory required for each frame, it is preferable to sample the data in real time and then to store additional frames when the sampling indicates a change in the image acquisition process. Such off-line processing embodiments require increased memory to keep more images, especially for the transition conditions between charging and good data, and between good data and bubbling.

Figure 2:
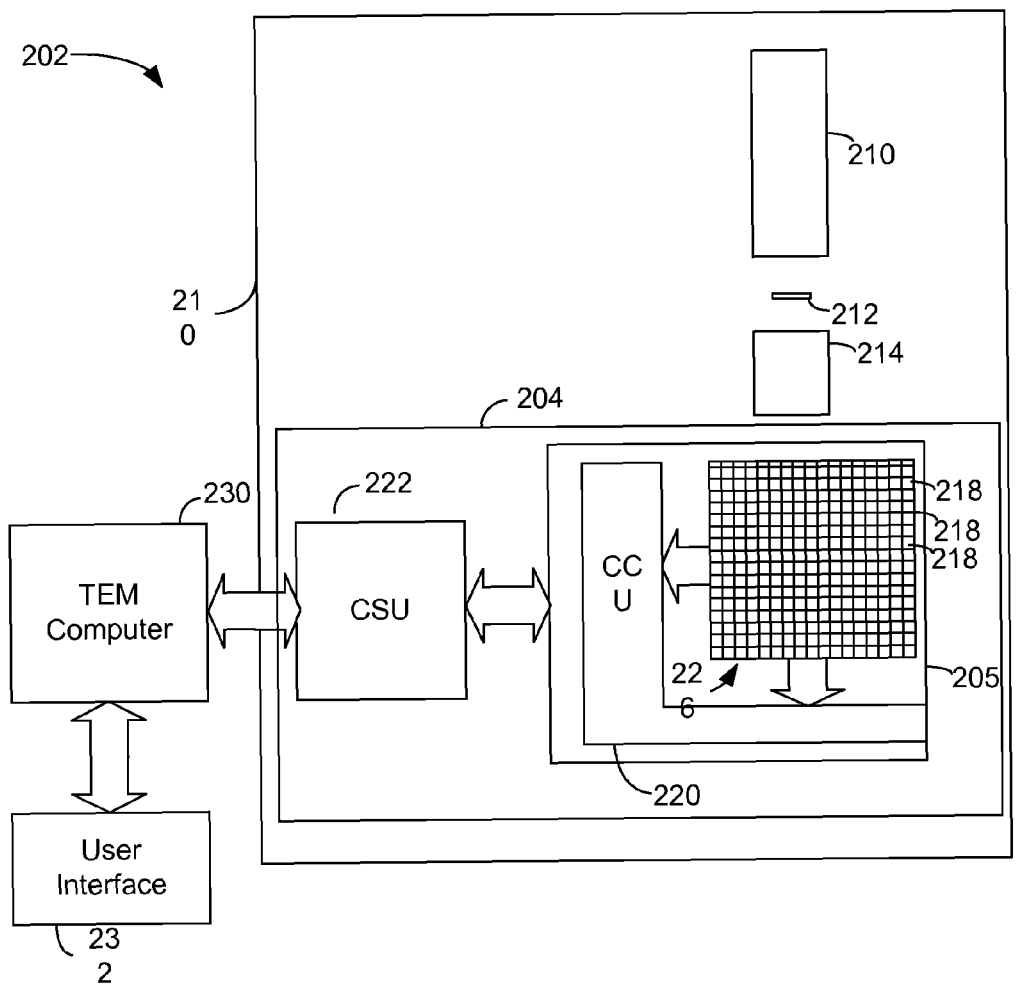
FIG. 2 is a schematic of a transmission electron microscope that uses an embodiment of the invention.

FIG. 2 shows a preferred embodiment of transmission electron microscope (TEM) 202 that employs a detector system 204 in accordance with a preferred embodiment of the invention. TEM 202 includes an upper electron column 210 that may include additional components, not shown, such as a condenser lens, aberration correctors, and deflectors. Upper electron column 210 forms a beam of electrons that is transmitted through a sample 212 and is then focused by a focusing lens 214 onto a pixel array 216 composed of multiple individual pixels 218. In one embodiment, the array comprises 4,096 by 4,096 pixels. The pixel array is preferably a CMOS monolithic active pixel sensor, as described by Turchetta, et al, above. Electrons impinging on a pixel 218 produce multiple electric charges, which accumulate and are periodically read out as electronic signals and digitized by a Camera Control Unit ("CCU") 220, which then transfers the data to a Camera Support Unit ("CSU") 222 for additional processing.

Figure 3:
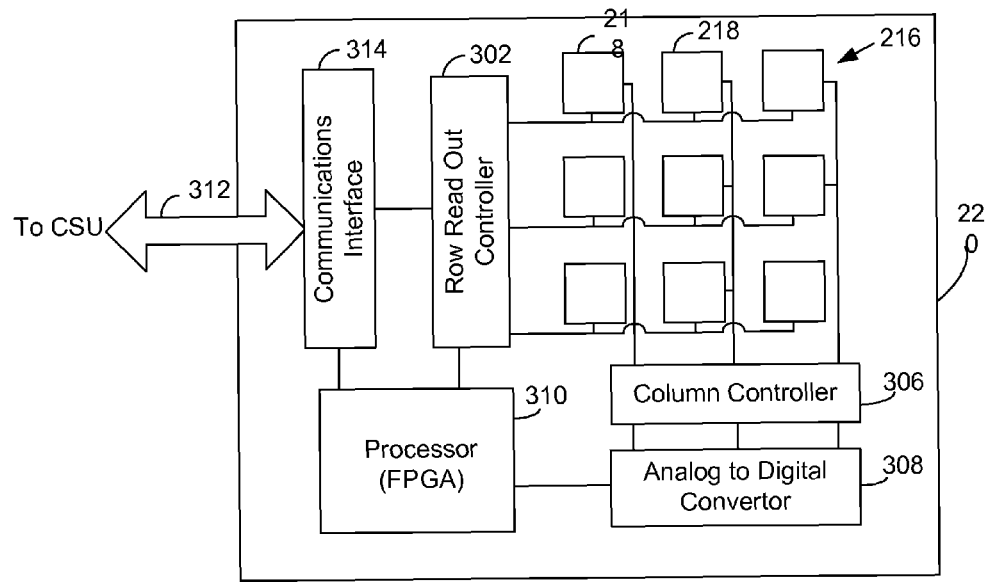
FIG. 3 is a schematic of a camera control unit in accordance with an embodiment of the invention.
Figure 4:
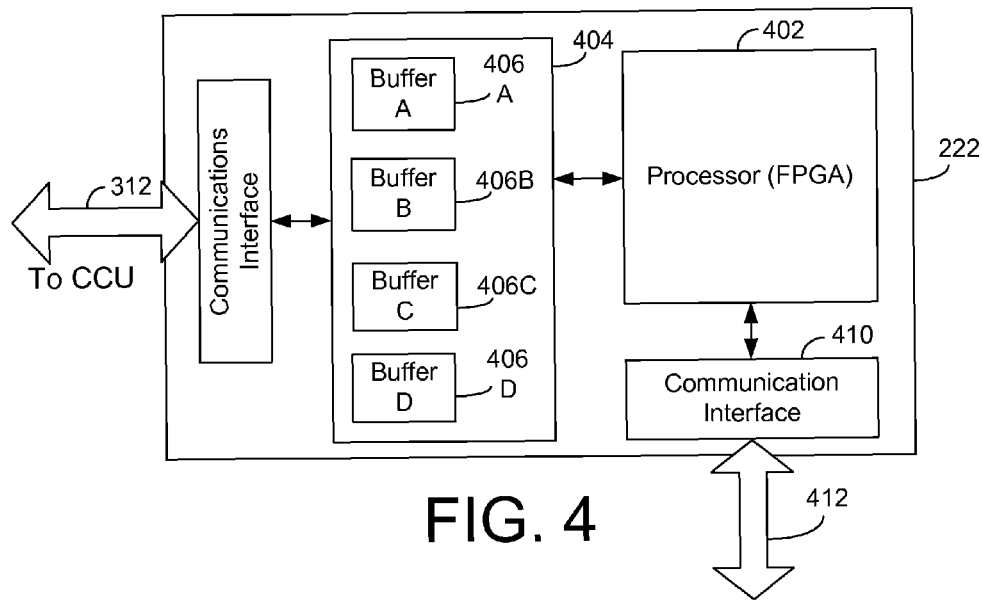
FIG. 4 is a schematic of a camera support unit in accordance with an embodiment of the invention.

FIG. 3 shows block diagram of CCU 220, while FIG. 4 shows a block diagram of CSU 222. CSU 220 includes a row read-out controller 302 that controls a switch at each pixel for reading out the data. A column controller 306 reads data from pixels in a row activated by row controller 302. The electronic signals from the pixels in the row are converted to digital signals by analog-to-digital converter 308. In one embodiment, the analog data read out from each pixel is converted by the CCU 220 to 14 bit digital data. A processor 310, such as a field programmable gate array (FPGA), controls the operation of the CCU 220 in accordance with preprogrammed logic and instructions from CSU 220. An FPGA can be programmed with the logic required for specific operations, and can be reprogrammed as necessary to perform different functions. Each individual frame of image data, that is, data representing the charge accumulated in a group of pixels at a specific time, is then transferred through communications interface 314 over a high-speed data link 312 to the CSU. An array of 4k by 4k pixels can be read out in about 25 ms, that is, at a frequency of about 40 Hz. The high speed data link 312 may include, for example, a 10 Gbit/s opto-link, which permits transmitting data corresponding to 4k by 4k pixels with 14 bit dynamic range per pixel at a rate of 40 Hz. As long as the data transfer rate is sufficient to accommodate all the pixel data at the desired frame rate, the data can be transferred without any data loss. Unlike CCD pixels, CMOS pixels provide the ability to read out the charge accumulated on less than all of the pixels, which can take significantly less time than reading out all the pixels. Smaller areas, such as an area of 512 pixels×512 pixels, can be read out in about 1.5 ms.

FIG. 4 shows that the CSU 222 includes a processor 402 programmed for processing pixel information from CCU 220 and a data memory 404 for storing pixel data. The processor 402 may comprise an FPGA. The data memory 404 may be divided into multiple memory areas, referred to as "buffers." FIG. 4 shows four buffers, 406A, 406B, 406C, and 406D, although different embodiments may include more or fewer buffers. Each of the buffers may contain multiple memory locations, including a memory location corresponding to each pixel in the detector. The memory locations can be used to contain the values read out from each pixel at a point in time. The memory locations can also be used to contain data accumulated from multiple read-outs, or calculation results corresponding to each pixel, such as a running average of a pixel or the average value of the pixels surrounding a pixel. Contents of the different buffers can be combined, for example, by averaging, multiplying or dividing.

The FPGA may be programmed to obtain data from the CCU for all or from a specified subset of pixels at different times, store the information in buffers, and compare the information. Depending on the results of the comparison, the CSU may be programmed to throw out data in one of the buffers, or to combined the data with good image data in a third buffer. Other manipulations of the data could include dark frame corrections, gain linearizations, and adding multiple images into a summed final camera image. In dark frame correction, one buffer stores data read out from the pixels while the electron beam is not directed to the sample. This "noise" is referred to as "dark frame" noise, and can be subtracted from each frame or from final image data. Gain linearization means adjusting the signal so that the signal from two electrons impacting a pixel is twice the signal from one electron.

CSU 222 is controlled by a TEM computer 230 (FIG. 2), which also controls the TEM 202. Data is transferred from the CSU to the TEM computer 230 through a communications interface 410 over an communications link 412, such as an Ethernet connection operating at a rate of 1 Gbit/s or 10 Gbit/s A user interface 232 can display the image to a user and can accept instructions from a user with regard to operation of the TEM 202 and the detector system 204.

One embodiment of the invention eliminates charging artifacts. The first electrons to impact the specimen generate mobile electron-hole pairs. The specimen, either at liquid nitrogen or liquid helium temperatures, is typically sufficiently conductive so that the mobile charge carriers repel each other and retreat to the corners of the detector array. The grid on which the sample is placed is an insulator and so the charges accumulate on the corners of the sample. An image usually shows significant streaking in the corners of the detector caused by the accumulated static electric charge. After a brief period, typically about 30 ms, secondary electrons generated by the impact of the electron beam, neutralize the charge, and the artifacts disappear.

One embodiment uses the three buffers to separate the first part of each acquisition, from a second primary part, and from a third final part. The first part includes charging artifacts, while the last part includes bubbling artifacts. The primary part includes the best data for forming an image.

Figure 5:
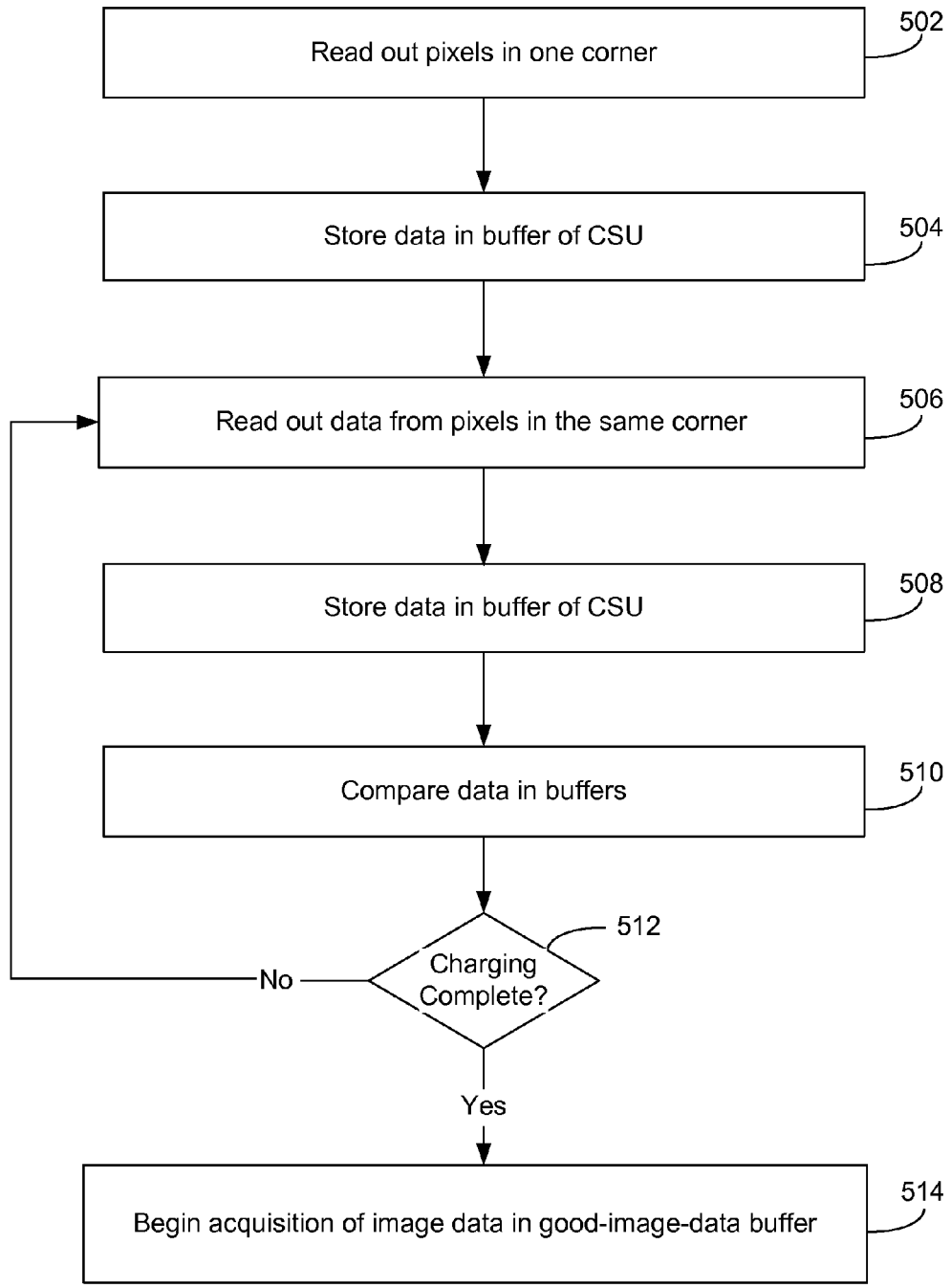
FIG. 5 is a flow chart of an embodiment of the invention used to detect and eliminate image artifacts caused by charging in cryo-TEM sample.

FIG. 5 shows a flow chart of an embodiment of the invention that detects initial specimen charging and forms an image that avoids charging artifacts. In step 502, pixels in one corner of the image, for example, from an array of 512 pixels by 512 pixels in the corner, are read by the CCU and transferred to the CSU. In some embodiments, multiple corners may be read. In step 504, the CSU stores the image data in a first data buffer.

In step 506, the CCU reads out a second set of pixel data from the same corner pixels at a time later than the time at which the first set of corner pixels was read out in step 502. Because only the pixels in one corner are read, the data can be retrieved from the pixels rapidly. A corner region of about 512 pixels by 512 pixels can be read out in about 1.5 ms. In step 508, the CSU stores the data in a second data buffer.

In step 510, the data in the two data buffers are compared to determine whether the image has stabilized. Various techniques can be used in step 510 to determine when the image has stabilized. For example, a two-dimensional cross-correlation can be performed on sequential images. As the image stabilizes, sequential frames will increasingly correlate. Alternatively, the content of the images in the x direction and y direction can be projected, and two one-dimensional correlations can be performed. Such correlations are described, for example, by Cain, et al., "Projection-Based Image Registration in the Presence of Fixed-Pattern Noise" *IEEE Transactions on Image Processing*, Vol. 10, No. 12, p. 1860 (2001). Cain, et al. claims that one-dimensional correlations are superior if the images suffer from fixed pattern noise, which is the case if the CCU provides image data that is not uncorrected for bias and nonlinearity of the gain. Alternatively, simple subtractions can be used to determine a shift that indicates that the sample is charging. As another alternative, changes in the statistics, such as the mean and variance, of the corner images might be used to detect the end of charging.

In decision block 512, the system determines, based on the analysis in step 510, whether the image has stabilized, that is, whether charging is complete. If the image is not stabilized, the process repeats with step 506. Each time a new dataset is read from the corner pixels in step 506, the new data overwrites the earliest data in one of the buffers, and the correlation is performed on the most recent pixel data and the second most recent pixel data. Alternatively, recent data can be compared with accumulated data from more than one previous read-out or from calculated values, such as averages or sums of earlier readouts.

When the correlation determines in decision block 512 that charging is complete, the CSU begins to accumulate data in a "good image data buffer" in step 514. The data being accumulated now corresponds to accurate image data, essentially free from the charging artifacts. Each subsequent set of pixel data, preferably read out at every 25 ms from a 4k by 4k pixel array, is added to the previous data in the good image data buffer during the image acquisition period. When image acquisition is complete, the accumulated data become the final image. Imaging can be completed after a predetermined period of time, when a sufficient number of electrons have passed through the sample, or when analysis of image data read out from the pixels indicate that data being read out is beginning to include artifacts. In some embodiments, as described below with respect to FIG. 6, image data continues to be monitored for other artifacts, such as bubbling, and image acquisition ceases when bubbling begins.

In an alternative embodiment, to avoid charging artifacts, the completion of the charging can be assumed after a specific period of time, such as 30 ms, and the data from the first 30 ms is stored in the first buffer, and subsequent data is stored in the second buffer. While this embodiment is simpler, it may result in loss of some good image data or inclusion of some image data that includes charging artifacts.

Figure 6:
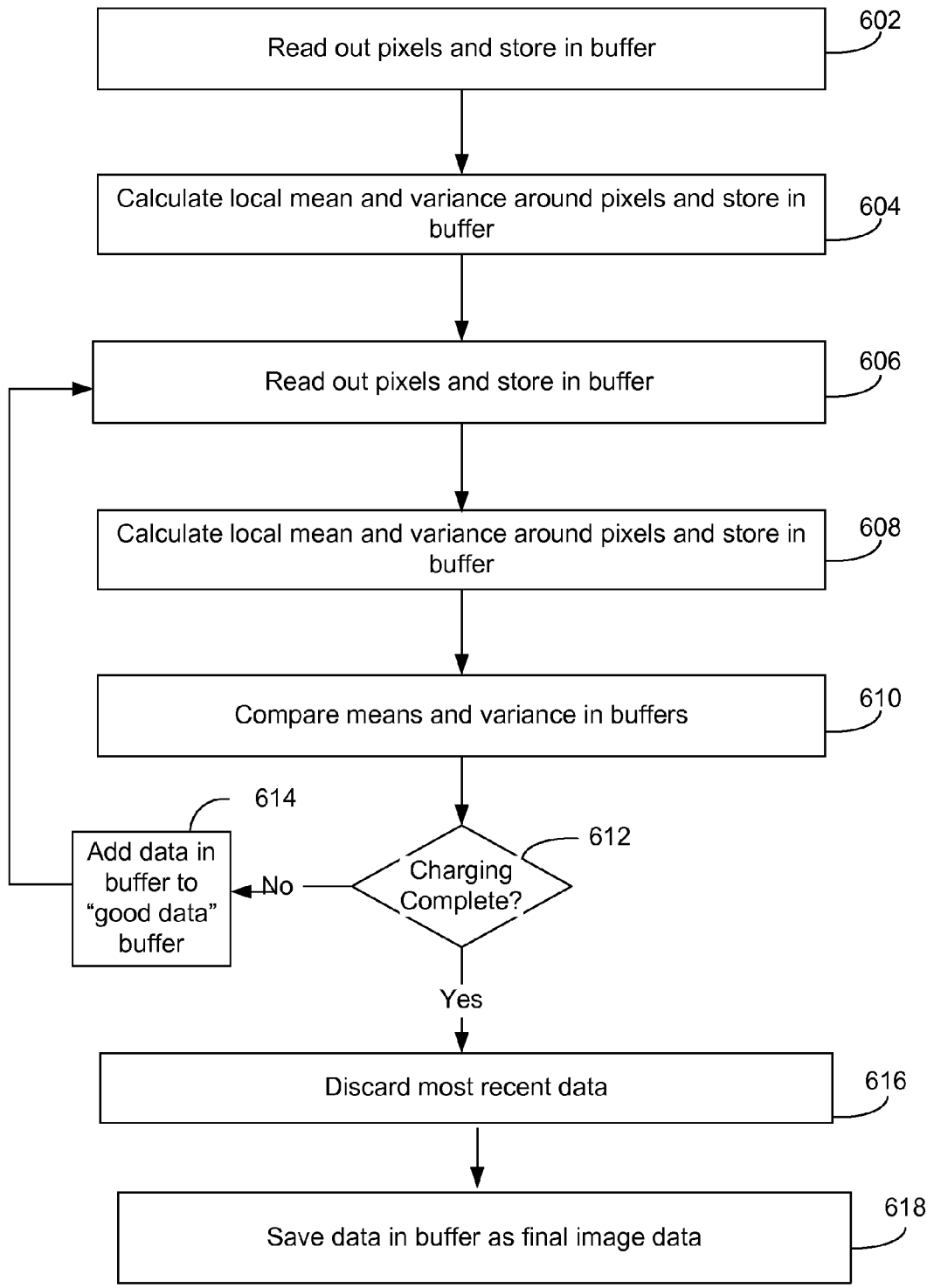
FIG. 6 is a flow chart of an embodiment of the invention used to detect and eliminate image artifacts caused by bubbling in cryo-TEM sample.

FIG. 6 is a flow chart of an embodiment of the invention that is used to detect the onset of bubbling. The rapidity of the onset of bubbling will depend to some extent on the sample and the electron beam current. Bubbling typically causes local effects on the sample and the effects are distributed throughout the image. At some distinct, unpredictable places, the image typically shows sharp spikes in brightness at the onset of bubbling. These spikes in brightness can be detected by any number of analysis algorithms. The processor applies local filters that specifically detect the effect of the bubbling. As with determining whether charging is complete, there are many possible ways to determine, collect, and analyze data to determine whether bubbling has started and the invention is not limited to any specific defection algorithm.

FIG. 6 describes a method of determining whether bubbling has commenced. In step 602, data is read out from all pixels or representative pixels and stored in a buffer. In step 604, the system calculates a mean and variance of a local group of pixels around each pixel and stores the calculated values in a buffer. For example, step 604 may entail calculating the mean and variance of a block of seven pixels by seven pixels centered on each pixel. In some embodiments, calculations are preformed only for representative pixels in the image, instead of all pixels.

In step 606, a second set of data is read from the pixel array and stored in a different buffer. In step 608, the system calculates a local mean and variance around each pixel in the second set of data, using the same procedure that was used in step 604. In step 610, the system compares the calculated means and variances from the two different frames to determine whether changes in the mean and variance indicate significant local changes, which would indicate the onset of bubbling.

Comparing each seven by seven frame in an array of 4096× 4096 pixels is a large computational task. Algorithms for processing large amounts of TEM image data are described, for example, in Zhu, Y et al., "Automatic particle selection: results of a comparative study," *Journal of Structural Biology* 145 (2004) 3-14; Roseman, A. M., 2003, "Particle finding in electron micrographs using a fast local correlation algorithm," *Ultramicroscopy* 94,225-236 (2003); and Roseman, A. M., "FindEM—a fast, efficient program for automatic selection of particles from electron micrographs," *Journal of Structural Biology* (2004). The algorithm described by Roseman uses three Fourier transforms, provided the mask of seven by seven pixels is circular.

Other methods of determining whether bubbling has begun is using texture analysis methods known in video processing, as described for example, in C. H. Chen et al., *The Handbook of Pattern Recognition and Computer Vision*, (2$^{nd}$ Edition) World Scientific Publishing Co., 1998. In particular, Gabor filtering could be used.

This processing is expedited if the data is re-binned before processing, that is, multiple pixels, such as a square of nine pixels, are combined and treated as a single, lower resolution pixel. For example, the CCU could treat groups of four pixels by four pixels as a single pixel, so that the array effectively includes 1k×1k, instead of 4k by 4k, which an attendant decrease in the number of calculations required. Another method of analyzing the data to determine bubbling is to perform a local cross-correlation, which is also described in Roseman's paper, between the current frame and one or more previous frames and look at the change of the correlation coefficient.

Decision block 612 shows that if the comparison in step 610 determines that bubbling has not commenced, then the most recently acquired data is added to the accumulated image data in the good image data buffer in step 614. The most recently acquired data is also retained for comparison with the next data. The process then repeats with step 606, reading out a new data set, calculating means and variances, and comparing the values calculated for each data set with the values calculated for the previous data set. New image data is preferably acquired at a rate of about 40 Hz. If decision block 612 shows that bubbling has begun, the most recently acquired data is discarded in step 616, and the image data stored in the good image data buffer becomes the final image data in step 618.

Another artifact that can be detected and corrected by the invention is drift. Over time, an image may tend to shift on the detector. Drift may occur, for example, because of small changes in temperature in the electron beam column that shifts the beam position, because of vibrations in the system, or because of instabilities in column voltages and currents. In one embodiment of the invention, frames can be read out at 40 Hz and correlated to the previous frame to determine the drift. This would remove any drift or shaking effects of frequencies less than 20 Hz. Such frame correlations work best if there are distinct features in the sample to correlate between frames and when the number of electrons impacting the sample in each frame is relatively high. Frame correlation has been used for images in a scanning electron microscope. Frame correlation algorithms are described, for example, in the Roseman articles above. Frame correlation techniques can compensate for drift at a resolution greater than the pixel spacing.

The invention provides unique capabilities that can be used for complete new acquisition schemes that are particularly useful in low dose imaging. Charging and bubbling show very quickly density differences compared to "good quality" images in a subset of the detector. By applying rapid image processing techniques to detect these small difference, one can detect specimen charging and beam-induced damage, to start and stop image acquisition to avoid artifacts.

Embodiments of the invention allow the image acquisition process to adapt in real time based on data being acquired. Among the modifications that could occur based on real time analyses of image data, are changes to the acquisition time, the region of interest, the binning mode. The analysis is limited only by the processing power and memory that is available.

While the embodiment above describes the use of an active pixel sensor that accumulates charge that is read out periodically, in other embodiments, impingement of an electron produces an electrical signal that is immediately transferred from the pixel, without waiting for a predetermined frame duration. While the invention was described implanted in a conventional transmission electron microscope, the invention can also be implemented in a scanning transmission microscope.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follows:

1. A detector system for a transmission electron microscope, comprising:
    an array of pixels for converting impinging electrons into an electronic signal during an imaging period;
    a first computer memory including multiple data storage areas for storing data captured by one or more of the pixels in the array at different times within the image acquisition period; and
    a processor programmed to analyze data from one or more of the pixels in the array at different times during the image acquisition period and to modify the image acquisition process based on the analysis results while the image is being acquired.

2. The detector system of claim 1 in which the processor is programmed to compare data read at different times from less than all of the pixels in the array to determine whether the image shows effects of sample charging.

3. The detector system of claim 1 in which the processor is programmed to compare data read at different times from pixels in the array to determine whether the image shows effects of sample bubbling.

4. The detector system of claim 1 in which the processor compares the data captured during a first portion of the image capture period with data captured during a later portion of the image capture period to locate local increases in brightness that would indicate bubbling exists.

5. The detector system of claim 1 in which the pixels comprise CMOS active pixel sensors.

6. A method of forming an image using a transmission electron microscope, comprising:
    directing an electron beam toward a sample;
    providing a detector that includes multiple pixels to detect electrons that pass through the sample;
    obtaining data from one or more of the multiple pixels during an image acquisition period;
    analyzing the data obtained from the one or more pixels in the array different times during the image acquisition period; and modifying the image acquisition process based upon the result of the analysis.

7. The method of claim 6 in which obtaining data from one or more pixels during an image acquisition period includes obtaining data from the one or more pixels at multiple times during the image acquisition period and comparing values derived from the one or pixels at different times.

8. The method of claim 7 in which obtaining data from the one or more pixels at multiple times includes reading out values of all pixels at least every 100 ms.

9. The method of claim 7 in which obtaining data from the one or more pixels at multiple times includes reading out values of pixels in one corner of the image to determine whether the image is affected by sample charging.

10. The method of claim 7 in which obtaining data from the one or more pixels at multiple times includes reading out values of all pixels to determine whether the image is affected by bubbling.

11. The method of claim 7 in which comparing values derived from the one or pixels at different times includes comparing statistics of local areas surrounding individual pixels.

12. The method of claim 7 in which modifying the image acquisition process based upon the result of the analysis includes discarding data including imaging artifacts.

13. The method of claim 7 in which modifying the image acquisition process based upon the result of the analysis includes modifying the image data to correct for drift.

14. A transmission electron microscope, comprising:
a source of electrons;
an electron optical column for directing the electrons toward a sample; and
an electron detector in accordance with claim 1.

* * * * *

UNITED STATES PATENT AND TRADEMARK OFFICE
CERTIFICATE OF CORRECTION

PATENT NO. : 8,338,782 B2
APPLICATION NO. : 13/217088
DATED : December 25, 2012
INVENTOR(S) : Luecken et al.

It is certified that error appears in the above-identified patent and that said Letters Patent is hereby corrected as shown below:

Title Page 1, (73), under "Assignee" heading please correct 'FBI Company, Hillsboro, OR (US)' to read, --FEI Company, Hillsboro, OR (US)--

In the Claims

Column 10, Line 66: Claim 6 please correct '…the array different times…' to read --…the array at different times…--

Signed and Sealed this
Sixteenth Day of July, 2013

Teresa Stanek Rea
*Acting Director of the United States Patent and Trademark Office*